United States Patent [19]
Erdelyi

[11] Patent Number: 4,779,015
[45] Date of Patent: Oct. 18, 1988

[54] LOW VOLTAGE SWING CMOS RECEIVER CIRCUIT

[75] Inventor: Charles K. Erdelyi, Essex Junction, Vt.

[73] Assignee: International Business Machines Corporation, Armonk, N.Y.

[21] Appl. No.: 53,670

[22] Filed: May 26, 1987

[51] Int. Cl.$^4$ .................. H03K 19/092; H03K 17/16; H03K 19/017

[52] U.S. Cl. ........................... 307/475; 307/443; 307/448; 307/451

[58] Field of Search ............... 307/448, 443, 451, 475

[56] References Cited

U.S. PATENT DOCUMENTS

| | | | |
|---|---|---|---|
| 4,031,409 | 6/1977 | Shimada et al. | 307/208 |
| 4,258,272 | 3/1981 | Huang | 307/475 |
| 4,295,065 | 10/1981 | Hseih et al. | 307/475 |
| 4,437,171 | 3/1984 | Hudson et al. | 365/177 |
| 4,438,352 | 3/1984 | Mardkha | 307/475 |
| 4,475,050 | 10/1984 | Noufer | 307/475 |
| 4,687,954 | 8/1987 | Yasuda et al. | 307/475 |

FOREIGN PATENT DOCUMENTS

| | | | |
|---|---|---|---|
| 0002266 | 1/1977 | Japan | 307/450 |
| 0038852 | 3/1977 | Japan | 307/475 |
| 0077516 | 5/1985 | Japan | 307/475 |

Primary Examiner—John S. Heyman
Assistant Examiner—M. R. Wanbach
Attorney, Agent, or Firm—Stephen J. Limanek

[57] ABSTRACT

A simple CMOS receiver or buffer circuit is provided which includes a first inverter having its output connected to the input of a second inverter with rapid switching action in the first inverter at even low input voltage swings achieved by a parallel circuit that alters the first inverter switching point under the control of the applied input voltage. Third and fourth inverters are added for increasing the drive capability of the circuit.

16 Claims, 2 Drawing Sheets

4,779,015

LOW VOLTAGE SWING CMOS RECEIVER CIRCUIT

DESCRIPTION

TECHNICAL FIELD

This invention relates to integrated semiconductor circuits and more particularly to complementary metal oxide semiconductor (CMOS) or complementary field effect transistor (FET) circuits which receive input signals from circuits having low voltage levels or swings.

BACKGROUND ART

Integrated semiconductor receiver or buffer circuits having low voltage input levels or swings, such as outputs from bipolar circuits, are known in the prior art.

U.S. Pat. No. 4,438,352, filed on Aug. 17, 1982, by M. M. Mardkha discloses a transistor-transistor logic (TTL) compatible CMOS input buffer which includes an input terminal connected to gate electrodes of a series circuit having first and second P channel transistors and a first N channel transistor and a second N channel transistor connected in parallel with the second P channel transistor, the output terminal being the common point between the first N channel transistor and the second P channel transistor.

Other examples of TTL to CMOS input buffers or level shift circuits include U.S. Pat. No. 4,258,272, filed on Mar. 19, 1979, by J. Y. Huang, U.S. Pat. No. 4,295,065, filed on Aug. 13, 1979, by P. K. Hsieh et al and U.S. Pat. No. 4,475,050, filed on May 5, 1983 by G. F. Noufer.

Also, U.S. Pat. No. 4,031,409, filed on May 26, 1976, by S. Shimada et al discloses a circuit for converting a binary signal from a bipolar transistor logic circuit to the levels required for binary signals by insulated gate field effect transistor circuits.

An emitter coupled logic (ECL) compatible CMOS circuit is disclosed in U.S. Pat. No. 4,437,171, filed Jan. 7, 1982, by E. L. Hudson et al.

Interfacing CMOS circuits to bipolar technologies poses some difficulties because the bipolar signal level changes or swings are much smaller than that which is required for the operation of the normal CMOS circuit. A CMOS circuit having a normal 5 volt power supply is generally optimized to switch its transistor elements at approximated 2.5 volts. However, known circuits in the bipolar technology have, e.g., the least positive up level of 1.5 volts and the least negative down level of 0.6 volts. Other bipolar circuits, e.g., the TTL circuits, have corresponding levels of 2 volts and 0.8 volts. It can be seen that the output voltages from these bipolar circuits cannot be readily used to switch the normal CMOS circuits. By modifying the dimensions of the N channel and P channel devices of the CMOS circuits, the center of the switching point can be shifted, however, the variations due to power supply and process parameters remain intolerably large.

DISCLOSURE OF THE INVENTION

It is an object of this invention to provide an improved, simple CMOS receiver circuit for low input voltage levels or swings which has high performance, high density and low, and under certain conditions 0, power dissipation.

In accordance with the teachings of this invention, an improved simple CMOS receiver or buffer circuit is provided which includes a first inverter having its output connected to the input of a second inverter with means connected in parallel with the first inverter to initiate a more rapid switching action in the first inverter at low input voltage swings.

More specifically, the CMOS receiver or buffer circuit includes a first series circuit having first and second P channel devices and a first N channel device with an input terminal connected to the control electrode of each of the devices and a second series circuit connected across the first P channel and first N channel devices, with an output terminal located at the common point between the first P channel device and the first N channel device.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
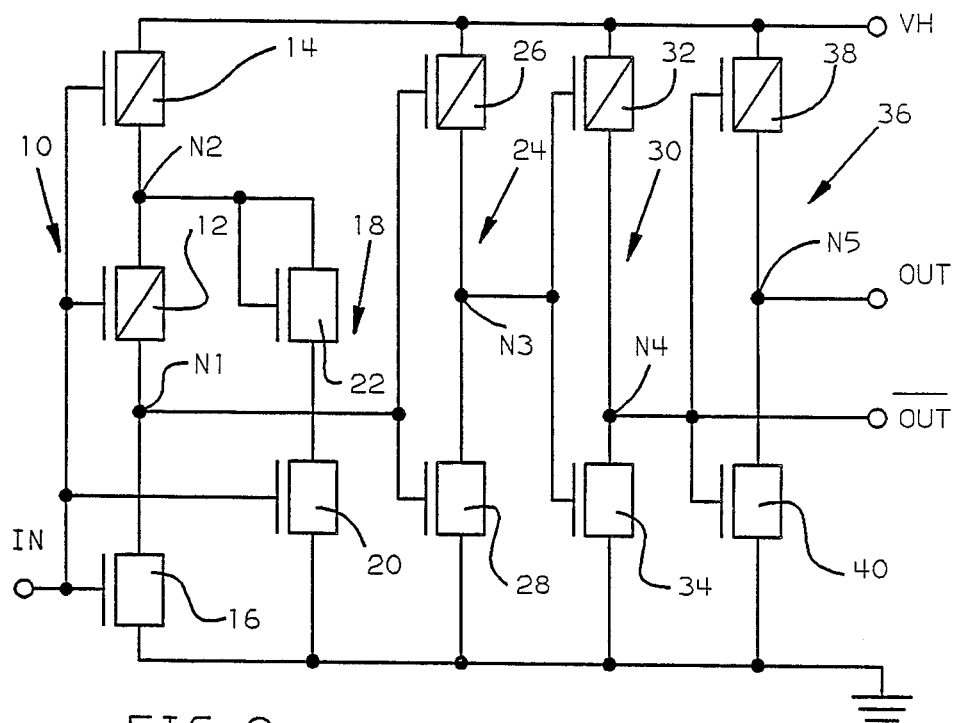
FIG. 1 illustrates an embodiment of the receiver or buffer circuit of the present invention.

Referring to the drawings in more detail, there is illustrated in FIG. 1 the CMOS receiver or buffer circuit of the present invention which includes a first series circuit 10 having first and second P channel transistors 12 and 14, respectively, and a first N channel transistor 16 and a second series circuit 18 having second and third N channel transistors 20 and 22, respectively, with the third N channel transistor 22 connected as a diode. The first series circuit 10, with an output node or terminal N1, is connected between a voltage supply terminal VH and a point of reference potential, such as ground, and the second series circuit 18 is connected from the common point N2 between the first and second P channel transistors, 12 and 14, respectively, and ground. Transistors 12 and 16 of the first series circuit 10 act as an inverter. An input terminal IN is connected to the control electrodes of the first and second P channel transistors 12 and 14, respectively, and of the first N channel transistor 16, as well as to the control electrode of the third N channel transistor 20.

The circuit of FIG. 1 further includes a first inverter 24 having a third P channel transistor 26 and a fourth N channel transistor 28 with output node or terminal N3 located at the drains thereof. The gate electrodes of the third P channel transistor 26 and the fourth N channel transistor 28 are connected to the output terminal N1 of the first series circuit 10. A second inverter 30 has a fourth P channel transistor 32, a fifth N channel transistor 34 and an output terminal N4, with its input connected to the output terminal N3 of the first inverter 24. A third inverter 36 has a fifth P channel transistor 38, a sixth N channel transistor 40 and an output terminal N5, with its input connected to the output terminal N4 of the second inverter 30. A true output signal from the circuit of FIG. 1 is provided at its output terminal OUT connected to the output terminal N5 of the third inverter 36 and a complement output signal from the circuit of FIG. 1 is provided at its output terminal $\overline{\text{OUT}}$ connected to the output terminal N4 of the second inverter 30.

The P channel transistor 14 of the first series circuit is a current source whose value is a function of the input voltage IN and power supply voltage VH, as well as the voltage at node N2. The transistor 22, connected as a diode, provides a process-dependent voltage offset from the drain of N channel transistor 20. The P channel transistor 12 is a current source whose value is a function of the input voltage IN and the conduction states of transistors 14, 20 and 22. Transistor 12 governs the amount of current that must be switched by the N channel transistor 16, and, as such, sets the switching point of the receiver circuit, i.e., when node N1 goes from a high voltage to a low voltage, or vice versa. The N channel transistor 16 is a switching device with its dimensions relative to the current generated by the P channel transistor 12 determining the value of the input voltage IN at which switching occurs in the receiver circuit. The N channel transistor 20 is a current source whose value depends on the input voltage. Transistor 20 is turned off completely at substantially low input voltages. Transistor 20, together with transistors 14 and 22, determines the source voltage of transistor 12, which, in turn, effects the current through transistor 12 and influences the switching point of the receiver circuit. For the up levels of the input voltages, transistor 12 turns off completely. The dimensions of the P channel transistor 26 and N channel transistor 28 of the first inverter 24 are selected to translate the switching point of the input stage of the receiver circuit to the optimal value for the subsequent inverter, buffer or amplifier stages 30 and 36. The correct selection of the dimensions of transistors 26 and 28 results in symmetric delay characteristics in the circuit.

Figure 2:
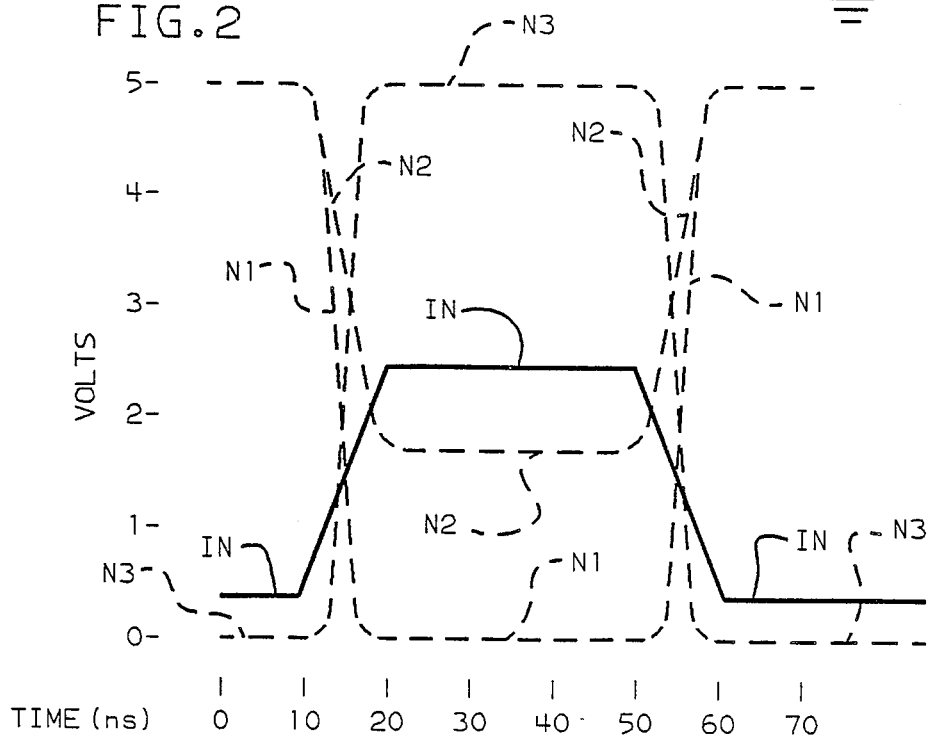
FIG. 2 is a graph of the voltages versus time at selected points in the circuit of FIG. 1 when a full input swing is applied to the input terminal.

The operation of the receiver or buffer circuit of FIG. 1 of the present invention may be better understood by referring to the graph of the voltages versus time at nodes or terminals IN, N1, N2, and N3 as shown in FIG. 2 of the drawings. With the voltage supply terminal VH being at, say, +5 volts and the input voltage at terminal IN being at +0.4 volts at time 0, the voltages at N1 and N2 are at +5 volts since P channel transistors 12 and 14 are turned on and transistors 16 and 20 are turned off, at this point the power dissipation being 0. With N1 being at +5 volts, the output voltage at N3 is 0 volts since transistor 28 is turned on and transistor 26 is off. At time 10 nanoseconds (ns), when the input voltage at IN begins to increase to about +2.4 volts, the voltage at N2 begins to decrease rapidly to about +1.8 volts, due to transistor 20 turning on. During the transition period, when the voltage at IN is increasing and the voltage at node N2 is decreasing, a point is reached at which P channel transistor 12 is turned off completely, allowing N channel transistor 16 to freely discharge node N1. The decrease in voltage at N1 causes the output of the first inverter 24 to switch rapidly from 0 volts to the full supply voltage of +5 volts within several nanoseconds. At time 20 ns, the input voltage IN is at its peak value of +2.4 volts, N1 is at 0 volts, N2 is at +1.8 volts and N3 at +5 volts. The input voltage IN between +0.4 and +2.4 volts may be considered as a full voltage swing from TTL bipolar circuits.

As indicated in the graph of FIG. 2, the voltages at IN, N1, N2, and N3 remain constant from time 20 ns to 50 ns when at 50 ns the input voltage IN is decreased toward +0.4 volts causing the voltage at N2 to rapidly increase toward +5 volts with the voltage at N1 increasing even more rapidly to +5 volts, while the voltage at N3 decreases to 0 volts. At time 60 ns, the voltages at IN, N1, N2, and N3 are at the same values as they were from time 0 to 10 ns. Although not indicated in the graph of FIG. 2, the voltage at the output terminal N4 of the second inverter 30 is the complement of the voltage at the output terminal N3 of the first inverter 24, i.e., when the voltage at N3 is high to indicate, e.g., a 1 binary digit of information, the voltage at the output terminal N4 is low to indicate a 0 binary digit. The voltage at N5 of the third inverter 36 corresponds to the voltage at N3 which represents the true output signal or voltage at terminal OUT of the receiver circuit of FIG. 1, while the voltage at N4 of the second inverter 30 represents the complement output signal or voltage at terminal $\overline{\text{OUT}}$ of the receiver circuit of FIG. 1.

Figure 3:
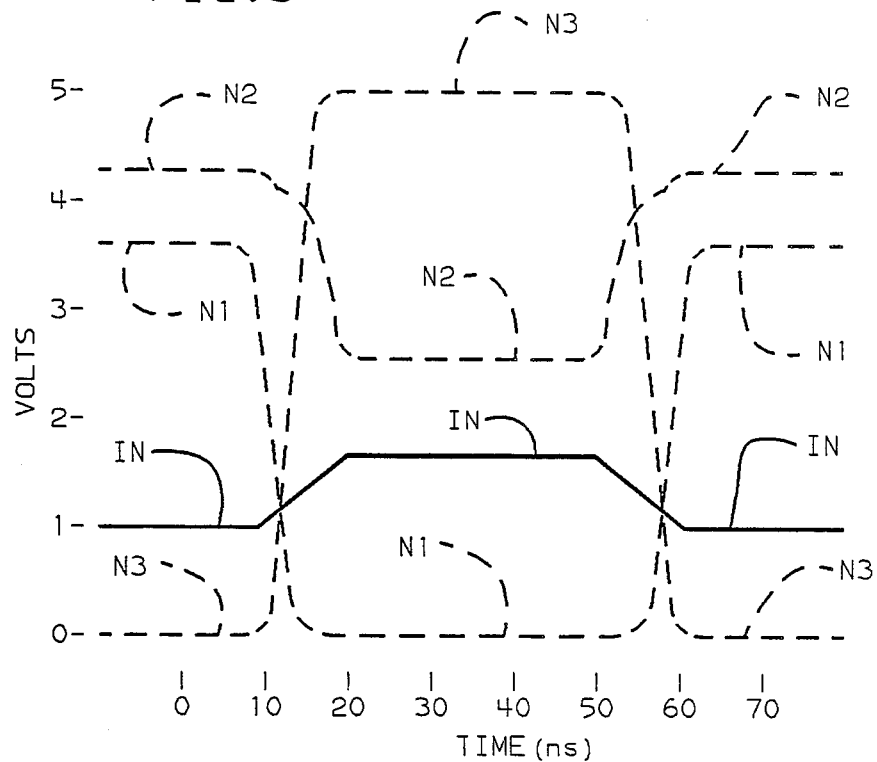
FIG. 3 is a graph of the voltages versus time at selected points in the circuit of FIG. 1 when a voltage input swing substantially smaller than the expected full input swing is received.

It should be noted that the receiver circuit of the present invention as illustrated in FIG. 1 of the drawings can operate successfully with an input voltage swing significantly smaller than that indicated by the graph of FIG. 2. For example, as indicated in FIG. 3 of the drawings, the input voltage swing at input terminal IN can extend only between about +1.1 and +1.7 volts to successfully operate this circuit. With the input voltage at terminal IN at +1.1 volts, while the supply voltage VH is at +5 volts, N channel transistors 16 and 20 are slightly on with the P channel transistors 12 and 14 being substantially on. Thus, due to voltage drops through P channel transistors 12 and 14, the voltage at N1 is at about 3.7 volts and at N2 is at about 4.2 volts, with N3 being near 0 volts, since the N channel transistor 28 of the first inverter 24 conducts substantially more than does the P channel transistor 26. When at 10 ns the input voltage IN begins to increase toward +1.7 volts, the voltage at N2 begins to fall to about +2.6 volts and the voltage at N1 begins to fall more rapidly toward 0 volts since the N channel transistors 16 and 20 conduct more heavily and the P channel transistor 12 is fully turned off. The voltage at N3 of inverter 24 thus rises rapidly from 0 to +5 volts since transistor 28 turns off and transistor 26 is turned further on. At time 50 ns the input voltage IN begins to decrease from +1.7 volts to +1.1 volts reducing the conduction of N channel transistor 16 and turning on P channel transistor 12, causing the voltages at N1 and N2 to return to +3.7 and +4.2 volts, respectively, and at N3 to return to 0 volts.

It should be understood that device or transistor parameters of the circuit must be suitably adjusted as is known so that current in the P channel transistors 12 and 14 and the N channel transistors 16 and 20 are appropriately controlled by the small input voltage swing IN indicated in FIG. 3 of the drawings for the entire range of expected power supply voltages and process parameters.

Figure 4:
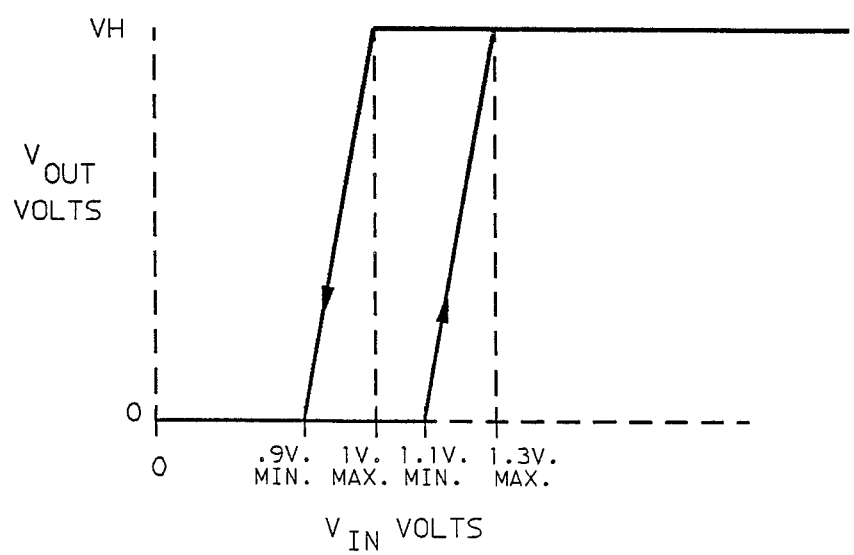
FIG. 4 is a graph indicating the transfer characteristics of the receiver or buffer circuit of FIG. 1.

In FIG. 4 there is shown a graph of the composite transfer characteristics of the receiver circuit of FIG. 1 for an expected range of power supply voltage, temperature and process parameter variations. It can be seen that when the voltage at input terminal IN increases to above +1.3, the voltage at the output terminal OUT always increases to VH and when the voltage at the input terminal IN is reduced below +0.9 volt, the voltage at the output terminal OUT always decreases to 0 volts.

It should be noted that appropriate modifications may be made to the circuit of FIG. 1 by those skilled in the art, if desired, e.g., transistor 22 may be formed as a conventional simple PN junction or as a resistive impedance. Furthermore, if desired, the control electrode of N channel transistor 20 of the second series circuit 18 may be connected to any appropriate point of reference potential in the range of 0 to VH volts, which may be constant or variable under external stimulation such as temperature, process conditions, etc. Also, various improvements of this circuit may be realized by utilizing appropriate known feedback techniques. Still another embodiment of the invention may be made by reversing the polarities of the transistors, as well as the ground and VH connections of the first series circuit 10 and the second series circuit 18, to use the circuit for detecting a small signal swing with reference to VH.

Although relatively low input voltage swings have been discussed hereinabove in connection with the operation of this receiver circuit, it should also be noted that input voltage swings from VH to ground may be used, if desired.

While the invention has been particularly shown and described with reference to preferred embodiments thereof, it will be understood by those skilled in the art that various changes in form and details may be made therein without departing from the spirit and scope of the invention.

What is claimed is:

1. A receiver circuit comprising
   first and second points of reference potential,
   a first series circuit including first and second transistors of a given type conductivity and a third transistor of an opposite type conductivity coupled between said first and second points of reference potential, each of said transistors having a control gate connected to an input terminal,
   a second series circuit including an impedance and a fourth transistor connected in parallel with said second and third transistors, and
   an output connected to the common point between said second and third transistors.

2. A receiver circuit as set forth in claim 1 wherein said impedance is a diode.

3. A receiver circuit as set forth in claim 1 wherein said impedance is a fifth transistor connected as a diode.

4. A receiver circuit as set forth in claim 3 wherein said fifth transistor is an N channel field effect transistor.

5. A receiver circuit as set forth in claim 1 wherein the control electrode of said fourth transistor is connected to said input terminal.

6. A receiver circuit as set forth in claim 1 wherein the control electrode of said fourth transistor is connected to a given point of reference potential.

7. A receiver circuit as set forth in claim 1 wherein said first and second transistors are P channel field effect transistors, said third and fourth transistors are N channel field effect transistors and said impedance is an N channel field effect transistor connected as a diode.

8. A receiver circuit as set forth in claim 1 wherein said impedance is disposed between said fourth transistor and a common point between said first and second transistors.

9. A receiver circuit as set forth in claim 1 wherein said first transistor is connected to said first point of reference potential and said third transistor is connected to said second point of reference potential.

10. A receiver circuit as set forth in claim 9 further including an inverter having an input connected to said output.

11. A receiver circuit as set forth in claim 9 wherein said first point of reference potential includes a power supply terminal having a positive voltage and said second point of reference potential is ground.

12. A receiver circuit as set forth in claim 11 further including first, second, and third inverters disposed between said first and second points of reference potential, each of said inverters having an input and an output, a true output voltage terminal and a complement output voltage terminal, the input of said first inverter being connected to the common point between said second and third transistors, the input of said second inverter being connected to the output of said first inverter, the input of said third inverter being connected to the output of said second inverter, said true output voltage terminal being connected to the output of said third inverter and said complement output voltage terminal being connected to the output of said second inverter.

13. A receiver circuit comprising
    first and second points of reference potential,
    first and second P channel field effect transistors, each having a control electrode,
    first and second N channel field effect transistors, each having a control electrode, said first P channel transistor being electrically connected between said first point of reference potential and said second P channel transistor, said first N channel transistor being electrically connected between said second point of reference potential and said second P channel transistor and said second N channel transistor being interposed between said second point of reference potential and the common point between said first and second P channel transistors,
    an impedance disposed between said second N channel transistor and the common point between said first and second P channel transistors, said impedance and said second N channel transistor being arranged as a series circuit between said common point and said second point of reference potential,
    an input terminal connected to the control electrodes of said transistors, and
    an output coupled to a point disposed between said first N channel transistor and said second P channel transistor.

14. A receiver circuit as set forth in claim 13 wherein said impedance is a diode.

15. A receiver circuit as set forth in claim 13 wherein said impedance is a transistor connected as a diode.

16. A receiver circuit as set forth in claim 13 further including an inverter having an input connected to said output.

* * * * *